United States Patent [19]

Davies

[11] Patent Number: 4,513,306

[45] Date of Patent: Apr. 23, 1985

[54] CURRENT RATIOING DEVICE STRUCTURE

[75] Inventor: Robert B. Davies, Tempe, Ariz.

[73] Assignee: Motorola, Inc., Schaumburg, Ill.

[21] Appl. No.: 453,438

[22] Filed: Dec. 27, 1982

[51] Int. Cl.³ .............................................. H01L 29/72
[52] U.S. Cl. ....................................... 357/36; 357/34; 357/35; 357/46
[58] Field of Search .................... 357/36, 34, 46, 20, 357/51, 35

[56] References Cited

U.S. PATENT DOCUMENTS

| 3,252,063 | 5/1966 | Ziffer | 357/36 |
| 3,402,330 | 9/1968 | Archer | 357/36 |
| 3,576,476 | 4/1971 | Kerr | 357/36 |
| 3,579,059 | 5/1971 | Widlar | 357/36 |
| 3,582,723 | 6/1971 | Kerr | 357/36 |

Primary Examiner—Andrew J. James
Assistant Examiner—Mark Prenty
Attorney, Agent, or Firm—Robert M. Handy

[57] ABSTRACT

A current ratioing device structure wherein a line of equally spaced emitter regions is parallel to another line of equally spaced base contact portions all within a base region. All of the emitter regions except the first and last emitter region in the line have contact portions so that the first and last emitter regions are "dummy" emitters.

16 Claims, 7 Drawing Figures

CURRENT RATIOING DEVICE STRUCTURE

BACKGROUND OF THE INVENTION

The present invention pertains in general to integrated circuit device structures and in particular to current ratioing device structures for providing proportional output currents.

In some integrated circuit devices it is useful to have a number of current sources or current sinks providing proportional collector currents.

For transistors having the same common-emitter forward-current transfer ratio, $\beta$, and having the same characteristic relationship between base-emitter voltage drop. $V_{BE}$, and collector current, $I_C$, the current sunk by a given collector is a direct function of the area of the associated emitter for a given $V_{BE}$.

Planar technology is most commonly used in the fabrication of integrated circuits. In this technology, the devices and components forming the integrated circuit extend below the surface of one plane of a silicon substrate. The devices and components are formed by selective diffusion of dopants into the substrates, each dopant creating a region of a characteristic conductivity type in the volume into which it diffuses. In order to control the zones of diffusion of the dopants, the layer of silicon to be treated is first covered by a layer of silicon dioxide, $SiO_2$. The $SiO_2$ is then coated with a photosensitive material known as a photoresist which may, for example, polymerize and harden in the presence of ultraviolet light. A photographic negative of a pattern of desired windows to be etched in the $SiO_2$ is placed on the surface of the photoresist and ultraviolet light is shined through the negative to harden the photoresist except in those areas covered by the window pattern. After removing the negative and dissolving the unexposed portions of the photoresist, the $SiO_2$ layer is etched away in those areas not covered by the hardened photoresist by exposure to a buffered hydrofluoric acid solution to provide a pattern of exposed portions of the layer beneath the $SiO_2$ to be doped. A dopant tending to produce a region of a desired conductivity type is then diffused into the layer through the windows.

In one approach to current ratioing, the goal is to provide transistor emitters having areas proportional to the desired collector currents. However, because the emitter dopant diffuses out beneath the $SiO_2$ layer beyond the edge of the etched window, the proportionality of areas on the photographic negative is not maintained in the doped regions.

Another approach to providing devices having a desired current ratio involves the use of a plurality of emitter regions having a unitary size. For example, in order to provide a first emitter for a first transistor and a second emitter for a second transistor so that the second emitter has twice the area of the first emitter, a single emitter area of unit size is used for the first emitter and two emitter areas of unit size are used for the second emitter. Because windows laid out to have equal area on the photographic negative should result in regions exhibiting the same amount of out-diffusion, the proportionality problem that exists where single windows having proportional areas are used is solved. However, if it is a relatively long distance, such as the distance found between transistors, between a sidewall of a given window in the photoresist and the next window, the sidewall tends to bow due to the tension characteristics of the photoresist. This bowing results in strong second order effects from the bowed-out sidewalls of the diffused region which reduce the accuracy of this approach.

"Dummy" resistors at opposite ends of a line of resistors, have been used to reduce distortion due to photoresist tension effects. However, this technique has not been applied to area ratioing.

SUMMARY OF THE INVENTION

Accordingly, it is an object of the present invention to provide a new and improved current ratioing device structure.

It is a further object of the present invention to provide a new and improved current ratioing device structure which exhibits neither the proportionality problem associated with out-diffusion nor the proportionality problem associated with second order effects due to photoresist tension found in other approaches.

Yet another object of the present invention is to provide a new and improved current ratioing transistor geometry.

Still another object of the present invention is to provide a new and improved emitter ratioing device structure.

Among the advantages of the present invention are the ease and inexpensiveness with which the present invention is achieved by using commonly practiced planar integrated circuit fabrication technology.

These and other objects and advantages of the present invention will become apparent to those skilled in the art upon consideration of the accompanying specification, claims and drawings.

In order to attain the above-mentioned and other objects and advantages, the apparatus of the present invention involves a current ratioing device structure located on a surface of a body of semiconductor. The current ratioing device structure comprises a region of a first conductivity type having at least three contact portions and surrounding at least one medial region of a second conductivity type. Each medial region is separated from a nearest contact portion of the first conductivity type by a first distance and from each of two next nearest contact portions of the first conductivity type by a second distance. Each of the medial regions has a contact portion. On opposite sides of the at least one medial region are two contactless lateral regions of the second conductivity type, each of which is separated from the nearest contact portion of the first conductivity type by the first distance, each of which is separated from a next nearest contact portion of the first type by the second distance and each of which is lateral to and in line with the at least one medial region. A region of the second conductivity type surrounds the region of the first conductivity type.

BRIEF DESCRIPTION OF THE DRAWINGS

FIG. 2A is a planar view of a prior art semiconductor device for implementing a first transistor of the circuit portion of FIG. 1;

DESCRIPTION OF THE PREFERRED EMBODIMENT

Figure 1:
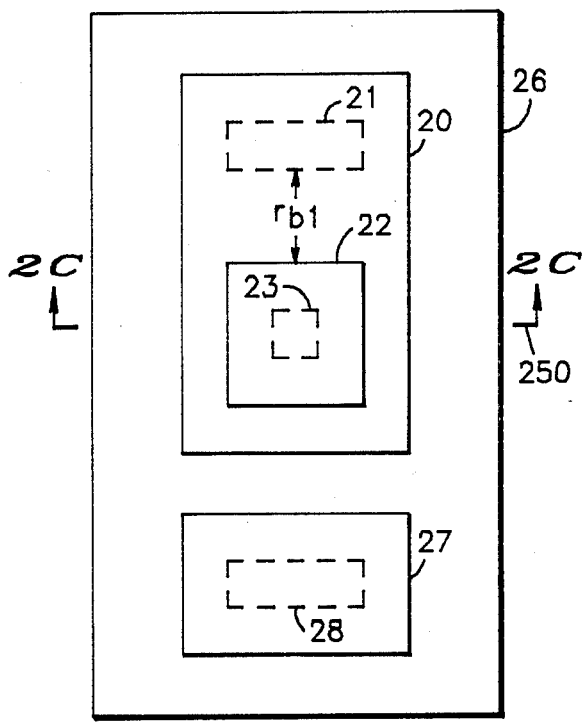
FIG. 1 is a schematic diagram of a portion of an integrated circuit which may be implemented according to the present invention.
Figure 1:
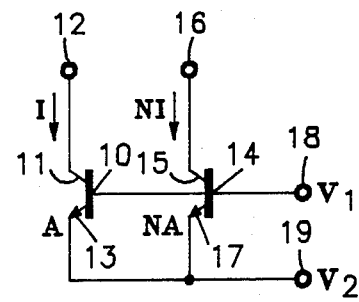
Figure 2C:
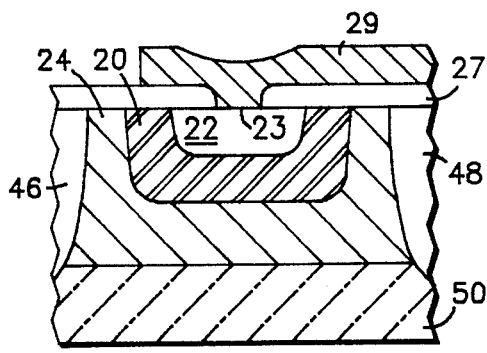
FIG. 2C is a schematic side view, in cross-sectional form, of the device of FIG. 2A.
Figure 2B:
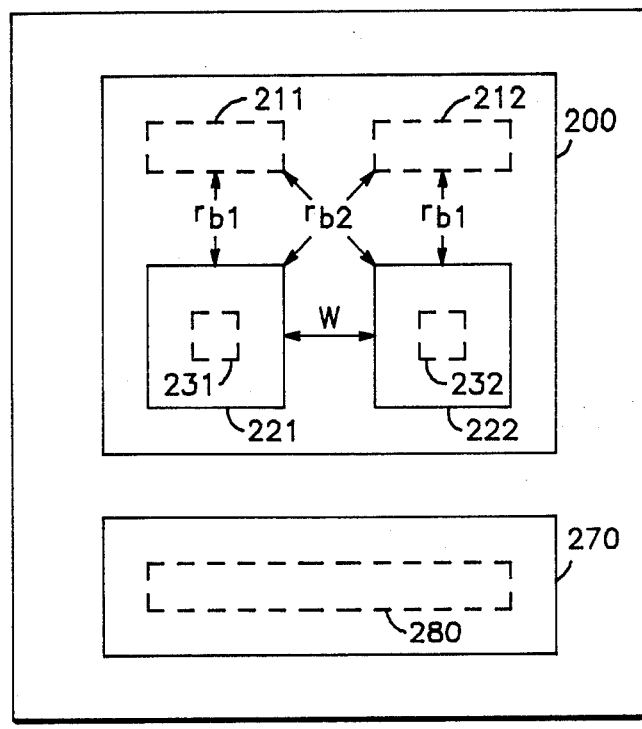
FIG. 2B is a planar view of a prior art semiconductor device for implementing a second transistor of the circuit portion of FIG. 1.

In a portion of an integrated circuit, as shown in FIG. 1, a first transistor has a base 10, a collector 11 with a collector current I and an emitter 13 with an area A. A second transistor has a base 14, a collector 15 with a collector current NI and an emitter 17 with an area NA. Collector 11 and collector 15 are respectively connected to a first terminal 12 and a second terminal 16. Base 10 and base 14 are both connected to a terminal 18 suitable for application of a first potential, $V_1$. Emitters 13 and 17 are connected to a terminal 19 suitable for application of a second potential, $V_2$. Connection of other circuit portions to terminals 12 and 16 respectively provides a current sink of magnitude I and a current sink of magnitude NI.

Where N equals 2, FIGS. 2A and 2B illustrate one prior art approach to emitter ratioing.

In FIG. 2A, a rectangular base region 20 has a rectangular contact portion 21 and surrounds a square emitter region 22 with a side parallel to the longest side of contact portion 21 and aligned therewith. Emitter region 22 has a centered square contact portion 23. Base region 20 is itself surrounded by a rectangular collector region 26 which also surrounds a rectangular low resistivity region 27. Region 27 is parallel to and aligned with a short side of base region 20. Low resistivity region 27 contains a centered, rectangular collector contact portion 28.

FIG. 28 represents a prior art approach to producing a transistor capable of sinking twice the current of transistor of FIG. 2A. A rectangular base region 200 has two equal and congruent rectangular contact portions each having a long side parallel to a first long side of region 200. Base region 200 surrounds two equal and congruent square emitter regions 221 and 222 which are aligned with each other and parallel to a second long side of region 200. Region 221 has a centered square contact portion 231 and region 222 has a centered square contact portion 232. Region 221 is aligned with region 222 and is separated from region 222 by a distance W. Portion 211 is separated from portion 212 by a distance W and is aligned with region 221 perpendicular to the alignment of region 221 with region 222. In this way emitter regions 221 and 222 and base contact portions 211 and 212 form a rectangular array with the base portions 211 and 212 in a line along a first horizontal row, emitter regions 221 and 222 in a line along a second horizontal row, base portion 211 and emitter region 221 in a line along a first column and base portion 212 and emitter region 222 in a line along a last column.

Base region 200 is itself surrounded by a rectangular collector region 260 which also surrounds a rectangular low resistivity region 270. Region 270 is parallel to and aligned with a long side of base region 200. Low resistivity region 270 contains a centered, rectangular collector contact portion 280.

As indicated in FIG. 2A, the base resistance $R_b$, which is the resistance in series with a base lead applied to a base contact portion, is equal to the single resistance along a direct path between contact portion 21 and emitter region 22. However, in the structure of FIG. 2B, $R_b$ must include the base resistances $r_{b2}$ along diagonals of the array. Thus, for FIG. 2A, $$R_b = r_{b1}$$

but for the structure of FIG. 2B the diagonal resistances in parallel with $r_{b1}$ must be considered so that $$R_b = \frac{r_{b1} \parallel r_{b2}}{2}$$

Therefore, due to the disproportionality in base resistance, the structure of FIG. 2B does not perform as an integral multiple current ratioing structure with respect to FIG. 2A unless additional resistances are provided with the attendant difficulty of implementation and extra cost.

In FIG. 2C, a side view is shown in cross-sectional form along a cut line 250 of FIG. 2A wherein structures which are shown in FIG. 2A are identified by the numerals used to refer to them in FIG. 2A. An $n^-$ epitaxial layer is grown on a p-type substrate 50 to provide a collector region 24. Following surface oxidation, masking and etching, p+ isolation walls 46 and 48 are diffused into the $n^-$ layer to provide p+ isolation walls. Using the oxidation, masking, etching, and diffusion steps discussed above and well-known to those skilled in the art, a p-type diffusion is used to create base region 20 and a n+-type diffusion is used to create an emitter region 22. An $SiO_2$ oxidation layer 27 is grown on all of emitter region 22, base region 20, collector region 24 and isolation walls 46 and 48. Contact portions 21 and 28 are formed in a similar fashion using means well-known in the art. A preohmic contact window is etched in oxidation 27 to delimit emitter contact portion 23. A portion of a metallization pattern 28 is deposited on the surface of oxidation 27 and through the preohmic contact window above portion 23 to make contact with emitter 22.

Due to the mutual proximity of the openings in the photoresist used to produce emitter regions 221 and 222 the medial walls of the regions, that is the walls defined by the distance W, are well defined, but the lateral walls of the emitter regions, directly opposite the medial walls, tend to be bowed out leading to third effects. These third order effects involve the addition of terms to the equation for $R_b$ to account for the components of base resistance coming around the lateral walls of the emitter regions. Therefore, because the $R_b$ of the device of FIG. 2B is not exactly twice the $R_b$ of the device of FIG. 2A due to both layout and photoresist tension effects, the emitter ratioing technique embodied in the devices of FIGS. 2A-C is unsatisfactorily imprecise.

Figure 3B:
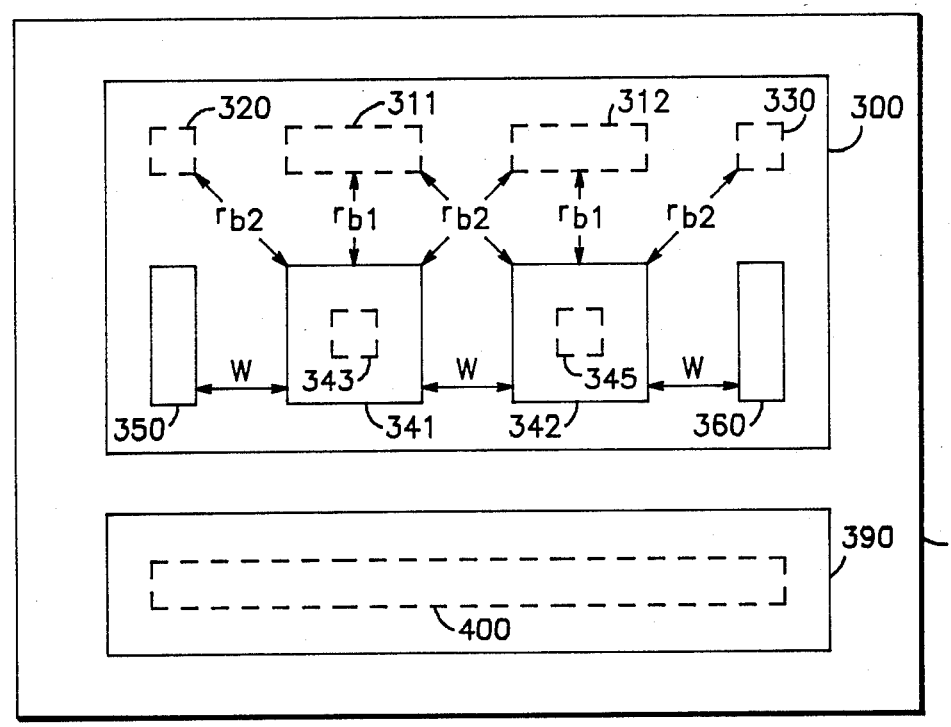
FIG. 3B is a planar view of a semiconductor device constructed according to the present invention for implementing a second transistor of the circuit portion of FIG. 1.
Figure 3A:
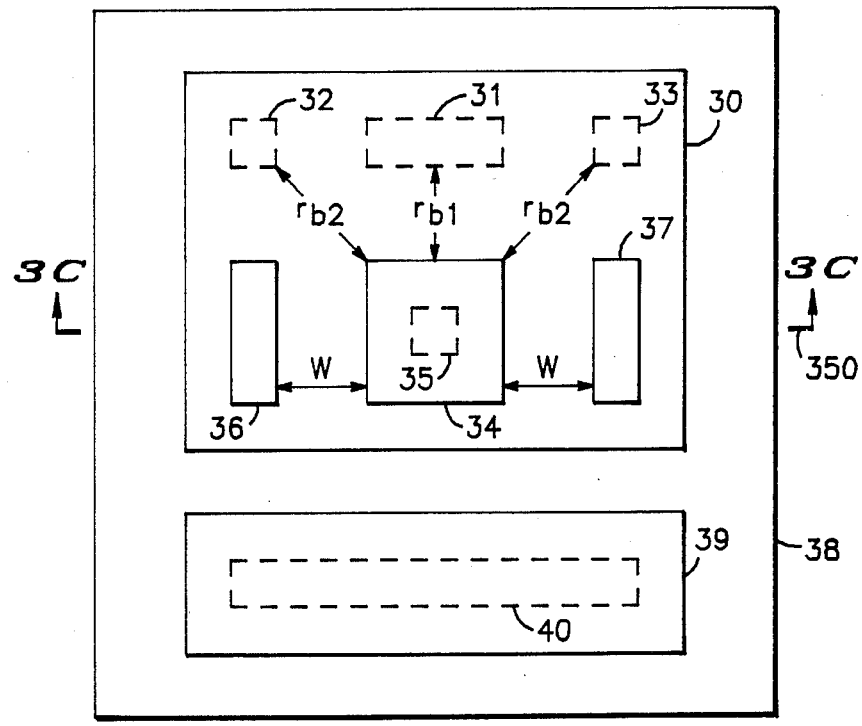
FIG. 3A is a planar view of a semiconductor device constructed according to the present invention for implementing a first transistor of the circuit portion of FIG. 1.

In a plane view of a current ratioing structure according to the present invention as illustrated in FIG. 3A, a rectangular base region 30 has a rectangular medial contact portion 31 having a long side parallel to a first long side of region 30 and has a first and a second equal and congruent, square lateral contact portion 32 and 33 which are aligned with contact portion 31 and each of which has a side parallel to the first long side of base region 30. Base region 30 surrounds a square medial emitter region 34 which is aligned with base contact portion 31 and which has a centered square contact portion 35. Base 30 also surrounds two equal and congruent rectangular lateral emitter regions 36 and 37 each of which has a short side equal in length to the length of a side of base contact portion 32 and 33 and each of which has a long side equal in length to a side of medial emitter region 34. Base contact portions 31, 32 and 33 each have a side nearest to an emitter region which lies along a first line which is parallel to a second line along which each of emitter regions 34, 36 and 37 have a side nearest to a base region. A collector region 38 surrounds base region 30 and also surrounds a rectangular portion of low resistivity material 39 which has a long side parallel to a second long side of base region 30. Centered within low resistivity region 39 is a rectangular collector contact portion 40.

As can be seen from FIG. 3A, a medial sidewall of each of emitter regions 36 and 37 is separated from a lateral sidewall of medial emitter region 34 by distance W. Likewise, each of lateral base contact portions 32 and 33 has a medial sidewall separated from a lateral sidewall of medial base contact portion 31 by the distance W. As is understood by those skilled in the art, W is chosen to insure that the outdiffusions of the different regions do not come into contact and to maintain a minimum photoresist width specified for the particular process used.

Therefore, a rectangular array is formed with base contact portions 32, 31 and 33 in sequence along a first horizontal row and emitter regions 36, 34 and 37 along a second horizontal row. Lateral base contact portion 32 and emitter region 36 form a first vertical column, medial base contact portion 31 and medial emitter region 34 form a second column and lateral base contact portion 33 and lateral emitter region 37 form a third vertical column.

As is understood by those skilled in the art, the first row containing the base regions, and the second row, containing the emitter regions, are separated by a distance sufficient to insure that outdiffusions from the emitter regions do not contact the base preohmic portions.

In the equation for the base resistance of the device of FIG. 3A, a perpendicular resistance between emitter region 34 and base contact portion 31 equal to $r_{b1}$ is in parallel with two equal, diagonal resistances equal to $r_{b2}$ associated with lateral base contact portions 32 and 33 so that the equation for the base resistance $R_b$ of the device of FIG. 3A becomes $$R_b = r_{b1} \parallel \frac{r_{b2}}{2}$$

It should be noted that regions 36 and 37 do not contribute to this equation because they are used in the present invention as "dummy" emitters.

A transistor geometry for a device capable of sinking twice the current of the device shown in FIG. 3A is shown in FIG. 3B. A rectangular base region 300 has a first rectangular medial contact portion 311 and a second medial rectangular contact portion 312 which is equal and congruent to contact portion 311 and which is aligned with contact portion 311. Base region 300 also has a first square, lateral contact portion 320 and a second square, lateral contact portion 330, which is equal and congruent to portion 320, both of which are aligned with portions 311 and 312. Base region 300 surrounds a first square medial emitter region 341, having a centered square contact portion 343, and a second square medial emitter region 342, having a centered square contact portion 345. Base region 300 also surrounds a first rectangular lateral emitter region 350 and a second rectangular lateral emitter region 360, which is equal and congruent to lateral emitter region 350. The base contact portions are aligned in the sequence 320, 311, 312 and 330 along a first line and are spaced from one another by a distance W. The emitter regions are aligned in a sequence 350, 341, 342 and 360 along a second line parallel to the first line and are separated in that sequence by a distance W. A short side of emitter region 350 is aligned with a first side of contact portion 320, a long side of contact portion 311 is aligned with a first side of emitter region 341, a long side of contact portion 312 is aligned with a first side of emitter region 342 and a short side of emitter region 360 is aligned with a side of contact portion 330 so that the base contact portions and the emitter regions within base region 300 form a rectangular array having a first horizontal row containing contact portion 320, 311, 312 and 330, a second horizontal row having emitter regions 350, 341, 342 and 360, and a first through fourth column containing portion 320 and region 350, portion 311 and region 341, portion 312 and region 342 and portion 330 and region 360 respectively.

A rectangular collector region 380 surrounds base region 300. A long side of a rectangular region of low resistivity 390 is aligned and coextensive with a long side of rectangular base region 300 and has a centered, rectangular collector contact portion 400.

The base resistance $R_b$ for the device of FIG. 3B is composed of two perpendicular resistances equal to $r_{b1}$ between emitter region 341 and base contact portion 311, and emitter region 341 and base contact portion 312, respectively. $R_b$ is further composed of two diagonal resistances equal to $r_{b2}$ and each being associated with emitter region 341 and each of contact portions 320 and 312, and two diagonal resistances each equal to $r_{b2}$ and each being associated with emitter region 342 and with each of portions 311 and 330. Therefore, $$R_b = \frac{r_{b1} \parallel (r_{b2}/2)}{2}$$

Lateral emitter regions 350 and 360 do not contribute to the equation for $R_b$ but serve as "dummy" emitter regions. Therefore, the base resistance of the two area device of FIG. 3B is exactly ½ that of the one area device of FIG. 3A.

Figure 3C:
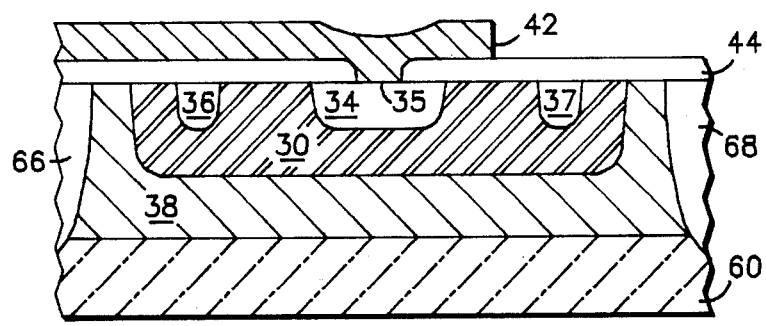
FIG. 3C is a schematic side view, in cross-sectional form, of the semiconductor device of FIG. 3A.

Turning now to FIG. 3C a side view, in cross-sectional form, of the device of FIG. 3A is shown and reference numerals also used in FIG. 3A identify side views of those same structures in FIG. 3C. An n+ epitaxial region is grown on a p-type substrate 60 to provide collector region 38. After oxidation, masking, etching, and diffusion, two p+-type diffusion regions 66 and 68 are formed to separate collector region 38 from adjacent devices and to form isolation walls. Using the same processes of oxidation, masking, etching and diffusion that are well known to those skilled in the art, a p-type base diffusion region 30 is formed in collector region 38 and two n+-type dummy emitter diffusion regions 36 and 37 as well as a medial emitter n+-type emitter region 34 are formed in base 30. An oxidation layer 44 is formed on surface of structures 66, 30, 36, 35, 37, 38 and 68. A preohmic contact window is etched in oxide 44 above emitter region 34 and a portion of a metallization pattern 42 is deposited in exposed surface of oxidation 44 and through the preohmic contact window above region 34 to make contact with portion 35.

The photoresist tension effects on $R_b$ are minimized for the active medial emitter regions of the present invention because the lateral tension is the same on both sides of each medial emitter region. Thus, the second order contributions to $R_b$ which result from having active emitter regions with differently shaped sidewalls are eliminated.

When attempting to area ratio in integral multiples, the currents to be supplied by two or more different NPN transistors on the same die, the matching of each emitter-base region of all the devices of concern is critical. The present invention has two distinct advantages over other approaches. First, the $R_b$ of the N area device is exactly 1/N times the $R_b$ of the one area device. Second, the area and side wall distance to the base contact portions of each active emitter region of the N area device are more closely matched to the area and side wall distance to the base contact portions of the one area device because photoresist tension effects for each individual emitter are identical.

When N is large, for example on the order of 10, the second order effects on $R_b$ have tremendous significance. Thus, a much higher level of precision is obtained by use of the present invention over other approaches.

While the present invention has been described in terms of a preferred embodiment, further modifications and improvements will occur to those skilled in the art. For example, although the present application has been described in terms of a NPN transistor structure, the present invention could be used beneficially to produce other semiconductor structures, such as a PNP device structure. Furthermore, although rectangular and square emitter regions and base contact portions are described in detail above, any regular polygonal shape, including circular, is intended to be included within the scope of the present invention as long as the arrangement and separation of elements is maintained substantially as described above. In addition, although the present invention has been described in terms of a 1:2 area ratioing circuit, it is understood by those skilled in the art that the present invention is not limited to this ratio and, in fact, circuits employing up to 10 medial emitters have been constructed to provide a 1:10 area ratio.

I desire it to be understood, therefore, that this invention is not limited to the particular form shown and that I intend in the appended claims to cover all such equivalent variations which come within the scope of the invention as claimed.

I claim:

1. A current ratioing device structure being located on a surface of a body of semiconductor and comprising:

a region of a first conductivity type having at least three contact portions;

at least one medial region of a second conductivity type, each medial region being of a uniform area, being surrounded by said region of said first conductivity type, being separated from a nearest contact portion of said first conductivity type region by a first distance, being separated from each of two next nearest contact portions of said first conductivity type region by a second distance and having a contact portion;

two contactless lateral regions of said second conductivity type, each being separated from a nearest contact portions of said first conductivity type region by said first distance, being separated from a next nearest contact portion of said first type by said second distance, and being lateral to and in line with said at least one medial region, each lateral region being on an opposite side of said at least one medial region; and a region of said second conductivity type surrounding said region of a first conductivity type.

2. The current ratioing device structure as recited in claim 1 wherein each of said regions of said second conductivity type comprise n-type material and wherein said region of said first conductivity type comprises p-type material.

3. The current ratioing device structure as recited in claim 1 wherein each of said regions of said second conductivity type regions comprise a p-type material and wherein each of said regions of said first conductivity type comprises n-type material.

4. A current ratioing transistor geometry being located on a surface of a body of semiconductor and comprising:

a rectangular array comprising a plurality of contact portions of a first conductivity type and a plurality of regions of a second conductivity type, said array having a plurality of horizontal rows and a plurality of vertical columns, said rows being spaced at a first width, said columns being spaced at a second width;

said plurality of contact portions being successively disposed in a first row from a first to a last column and said plurality of regions of a second conductivity type being successively disposed in a second row from said first to said last column; and each of said plurality of regions of a second conductivity type except a region in said first column and a region in said last column having a contact portion.

5. The current ratioing transistor geometry as recited in claim 4 wherein each of said regions of said second conductivity type comprises n-type material and wherein each of said portions of said first conductivity type comprises p-type material.

6. The current ratioing transistor geometry as recited in claim 4 wherein each of said regions of said second conductivity type comprises p-type material and wherein each of said portions of said first conductivity type comprises n-type material.

7. The current ratioing transistor geometry as recited in claim 4 further comprising a first outer region of said first conductivity type surrounding said plurality of contact portions and surrounding said plurality of regions of said second conductivity type.

8. The current ratioing transistor geometry as recited in claim 7 wherein each of said regions of said second conductivity type comprises n-type material and wherein each of said portions of said first conductivity type comprises p-type material.

9. The current ratioing transistor geometry as recited in claim 7 wherein each of said regions of said second conductivity type comprises p-type material and wherein each of said portions of said first conductivity type comprise n-type material.

10. The current ratioing transistor geometry as recited in claim 8 further comprising a second outer region of said second conductivity type surrounding said first outer region of said first conductivity type.

11. The current ratioing transistor geometry as recited in claim 9 further comprising an outer region of said second conductivity type surrounding said outer region of said first conductivity type.

12. An emitter ratioing device structure being located on a semiconductor die and comprising:
a plurality of regular polygonal emitter regions, each having a side along a first line and each being spaced at a fixed interval along said first line, wherein said plurality of emitter regions comprises a first contactless end region, a second contactless end regions, and at least one medial region therebetween, said at least one medial region having a contact portion;
a base region surrounding said plurality of regular polygonal emitter regions and having a plurality of regular polygonal contact portions, each with a side along a second line, said second line being parallel with said first line, each contact portion being spaced at said fixed interval along said second line and each side along said second line being aligned with and being coextensive with a corresponding side of an emitter region from among said plurality of regular polygonal emitter regions; and
a collector region surrounding said base region.

13. The emitter ratioing device structure as recited in claim 12 wherein each of said plurality of regular polygonal emitter regions comprises n-type material, wherein said base region comprises p-type material and wherein said collector region comprises n-type material.

14. The emitter ratioing device structure as recited in claim 12 wherein each of said plurality of regular polygonal emitter regions comprises p-type material, wherein said base region comprises n-type material and wherein said collector region comprises p-type material.

15. The emitter ratioing device structure as recited in claim 12 and having a plurality of medial emitter regions, wherein said side of each of said medial emitter regions along said first line has a uniform length.

16. The emitter ratioing device structure as recited in claim 12, having a plurality of medial emitter regions, wherein each of said plurality of medial emitter regions has the same area.

* * * * *